United States Patent
Chou et al.

(10) Patent No.: US 9,768,195 B2
(45) Date of Patent: Sep. 19, 2017

(54) SEMICONDUCTOR STRUCTURE WITH INTEGRATED PASSIVE STRUCTURES

(71) Applicant: INTERNATIONAL BUSINESS MACHINES CORPORATION, Armonk, NY (US)

(72) Inventors: Anthony I. Chou, Beacon, NY (US); Arvind Kumar, Beacon, NY (US); Renee T. Mo, Yorktown Heights, NY (US); Shreesh Narasimha, Beacon, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/196,735

(22) Filed: Jun. 29, 2016

(65) Prior Publication Data
US 2016/0307806 A1    Oct. 20, 2016

Related U.S. Application Data

(60) Continuation of application No. 14/864,080, filed on Sep. 24, 2015, now Pat. No. 9,425,079, which is a
(Continued)

(51) Int. Cl.
*H01L 21/338*    (2006.01)
*H01L 27/12*    (2006.01)
(Continued)

(52) U.S. Cl.
CPC .... *H01L 27/1203* (2013.01); *H01L 21/02181* (2013.01); *H01L 21/265* (2013.01);
(Continued)

(58) Field of Classification Search
CPC ............. H01L 27/0629; H01L 29/0649; H01L 29/945; H01L 29/517; H01L 23/5277;
(Continued)

(56) References Cited

U.S. PATENT DOCUMENTS 6,436,747 B1    8/2002    Segawa et al.
6,472,266 B1    10/2002   Yu et al.
(Continued)

OTHER PUBLICATIONS

Schwalke et al. "Corner-parasitics-free low-cost trench isolation", Electron Device Letters, IEEE, pp. 563-565, vol. 20, Issue 11, Nov. 1999.
(Continued)

*Primary Examiner* — Thinh T Nguyen
(74) *Attorney, Agent, or Firm* — Jennifer M. Anda; Andrew M. Calderon; Roberts Mlotkowski Safran Cole & Calderon P.C.

(57) ABSTRACT

A metal-oxide-semiconductor field-effect transistor (MOSFET) with integrated passive structures and methods of manufacturing the same is disclosed. The method includes forming a stacked structure in an active region and at least one shallow trench isolation (STI) structure adjacent to the stacked structure. The method further includes forming a semiconductor layer directly in contact with the at least one STI structure and the stacked structure. The method further includes patterning the semiconductor layer and the stacked structure to form an active device in the active region and a passive structure of the semiconductor layer directly on the at least one STI structure.

16 Claims, 8 Drawing Sheets

Related U.S. Application Data division of application No. 13/627,162, filed on Sep. 26, 2012, now Pat. No. 9,219,059.

(51) Int. Cl.

| | |
|---|---|
| H01L 23/522 | (2006.01) |
| H01L 21/762 | (2006.01) |
| H01L 49/02 | (2006.01) |
| H01L 27/06 | (2006.01) |
| H01L 21/02 | (2006.01) |
| H01L 21/265 | (2006.01) |
| H01L 21/3213 | (2006.01) |
| H01L 29/06 | (2006.01) |
| H01L 29/49 | (2006.01) |
| H01L 29/51 | (2006.01) |
| H01L 21/28 | (2006.01) |
| H01L 21/3065 | (2006.01) |
| H01L 21/3105 | (2006.01) |
| H01L 21/311 | (2006.01) |
| H01L 21/3205 | (2006.01) |
| H01L 21/84 | (2006.01) |
| H01L 23/525 | (2006.01) |
| H01L 29/423 | (2006.01) |
| H01L 21/306 | (2006.01) |
| H01L 21/308 | (2006.01) |
| H01L 21/8234 | (2006.01) |
| H01L 27/08 | (2006.01) |
| H01L 21/763 | (2006.01) |
| H01L 29/16 | (2006.01) |
| H01L 29/161 | (2006.01) |
| H01L 29/24 | (2006.01) |

(52) U.S. Cl.
CPC .. *H01L 21/26513* (2013.01); *H01L 21/28079* (2013.01); *H01L 21/28088* (2013.01); *H01L 21/3065* (2013.01); *H01L 21/3085* (2013.01); *H01L 21/30604* (2013.01); *H01L 21/31055* (2013.01); *H01L 21/31116* (2013.01); *H01L 21/32055* (2013.01); *H01L 21/32136* (2013.01); *H01L 21/32139* (2013.01); *H01L 21/76224* (2013.01); *H01L 21/76283* (2013.01); *H01L 21/823481* (2013.01); *H01L 21/84* (2013.01); *H01L 23/5227* (2013.01); *H01L 23/5256* (2013.01); *H01L 27/0629* (2013.01); *H01L 28/10* (2013.01); *H01L 29/0649* (2013.01); *H01L 29/42372* (2013.01); *H01L 29/495* (2013.01); *H01L 29/4966* (2013.01); *H01L 29/517* (2013.01); *H01L 21/763* (2013.01); *H01L 27/08* (2013.01); *H01L 29/16* (2013.01); *H01L 29/161* (2013.01); *H01L 29/1608* (2013.01); *H01L 29/24* (2013.01); *H01L 2924/0002* (2013.01); *H01L 2924/3011* (2013.01)

(58) Field of Classification Search
CPC .............. H01L 21/763; H01L 21/265; H01L 2924/3011; H01L 21/76224; H01L 28/10
USPC ........ 438/171, 329, 151, 152, 155.196, 200, 438/210, 381, 301; 257/350, 507, 508, 257/E21.156, E21.593
See application file for complete search history.

(56) References Cited

U.S. PATENT DOCUMENTS

| | | |
|---|---|---|
| 6,492,245 B1 | 12/2002 | Liu et al. |
| 6,962,840 B2 | 11/2005 | Kim |
| 7,091,106 B2 | 8/2006 | Bonser et al. |
| 7,183,593 B2 | 2/2007 | Yeo et al. |
| 7,399,672 B2 | 7/2008 | Lee et al. |
| 7,579,233 B2 | 8/2009 | Hwang et al. |
| 7,932,146 B2 | 4/2011 | Chen et al. |
| 7,994,576 B2 * | 8/2011 | Tseng ................. H01L 27/0629 257/350 |
| 8,018,005 B2 | 9/2011 | Doris et al. |
| 8,058,125 B1 | 11/2011 | Lin et al. |
| 8,080,842 B2 | 12/2011 | Lee |
| 8,093,118 B2 | 1/2012 | Tseng et al. |
| 8,158,483 B2 | 4/2012 | Ema et al. |
| 2004/0119128 A1 | 6/2004 | Clevenger et al. |
| 2005/0081781 A1 | 4/2005 | Lin et al. |
| 2005/0093047 A1 | 5/2005 | Goda et al. |
| 2005/0227440 A1 | 10/2005 | Ema et al. |
| 2006/0261398 A1 | 11/2006 | Lee |
| 2008/0246073 A1 | 10/2008 | Lee et al. |
| 2009/0090977 A1 | 4/2009 | Freeman et al. |
| 2010/0052072 A1 | 3/2010 | Li et al. |
| 2010/0059823 A1 | 3/2010 | Chung et al. |
| 2010/0237435 A1 | 9/2010 | Chudzik et al. |
| 2010/0320544 A1 * | 12/2010 | Tseng ..................... H01L 28/20 257/380 |
| 2010/0320561 A1 | 12/2010 | Xia et al. |
| 2011/0012205 A1 | 1/2011 | Lin et al. |
| 2011/0057267 A1 | 3/2011 | Chuang et al. |
| 2011/0156146 A1 | 6/2011 | Yang et al. |
| 2011/0198707 A1 | 8/2011 | Ema et al. |
| 2011/0215321 A1 | 9/2011 | Booth et al. |

OTHER PUBLICATIONS

Chen et al. "A novel 0.25/spl mu/in shallow trench isolation technology", Electron Devices Meeting, 1996, IEDM '96, International Publication Year: 1996, pp. 837-830.

Gokirmak et al. "Threshold voltage tuning and suppression of edge effects in narrow channel MOSFETs using surrounding buried side gate", Electronics Letters, vol. 41, Issue 3, Publication Year: 2005, pp. 157-158.

Matsuda et al. "Novel corner rounding process for shallow trench isolation utilizing MSTS (Micro-Structure Transformation of Silicon)", Electron Devices Meeting, 1998, IEDM '98 Technical Digest., International Publication Year: 1998, pp. 137-140.

Togo et al. "Improving the quality of sub-1.5-nm-thick oxynitride gate dielectric for FETs with narrow channel and shallow-trench isolation using radical oxygen and nitrogen", Electron Devices, IEEE Transactions on vol. 49, Issue 10, Publication Year: 2002, pp. 1736-1741.

Davari et al. "A variable-size shallow trench isolation (STL) technology with diffused sidewall doping for submicron CMOS", Electron Devices Meeting, 1988, IEDM '88 technical Digest., International Publication Year: 1988, pp. 92-95.

Ogura et al. "A shallow trench isolation with SiN guard-ring for sub-quarter micron CMOS technologies", VLSI Technology, 1998, Digest of Technical Papers. 1998 Symposium on Publication Year: 1998, pp. 210-211.

Horita et al. "Advanced shallow trench isolation to suppress the inverse narrow channel effects for 0.24 μm pitch solation and beyond", VLSI Technology, 2000, Digest of Technical Papers. 2000 Symposium on Publication Year: 2000, pp. 178-179.

Kim et al. "A shallow trench isolation using nitric oxide (NO)-annealed wall oxide to suppress inverse narrow width affect", Electron Device Letters, IEEE, pp. 575-577, vol. 21, Issue 12, Dec. 2000.

Cai et al. "Extending dual stress liner process to high performance 32nm node SOI CMOS manufacturing", SOI Conference, 2008. SOI IEEE International Publication Year: 2008, pp. 17-18.

Augendre et al. "Controlling STI-related parasitic conduction in 90 nm CMOS and below", IMEC vzw, Belgium, 1 page.

Notice of Allowance in related U.S. Appl. No. 15/196,681, dated Jan. 10, 2017, 8 pages.

Notice of Allowance in related U.S. Appl. No. 14/864,091 dated Mar. 1, 2017, 8 pages.

(56) References Cited

OTHER PUBLICATIONS

Office Action from U.S. Appl. No. 14/864,091 dated Nov. 2, 2016. 13 pages.

* cited by examiner

SEMICONDUCTOR STRUCTURE WITH INTEGRATED PASSIVE STRUCTURES

FIELD OF THE INVENTION

The invention relates to semiconductor structures and, more particularly, to a metal-oxide-semiconductor field-effect transistor (MOSFET) with integrated passive structures and methods of manufacturing the same.

BACKGROUND

Semiconductor fabrication processes and resulting semiconductor devices have significantly advanced over the years, creating higher performing devices with higher density and lower cost. These developments include geometric scaling of the semiconductor devices, which is made possible by many processes and material advances in the semiconductor industry. These advances allow fabrication of transistors such as, for example, complementary metal oxide semiconductors (CMOS) and bipolar junction transistors (BJT).

CMOS processes can be used to fabricate microprocessors, microcontrollers, static RAM, and other digital logic circuits. CMOS fabrication processes include the deposition and patterning of many layers, under certain conditions and process flows. For example, MOSFET devices can be formed with high-k-dielectric materials with metal gates, by deposition, lithography and etching processes.

SUMMARY

In one or more embodiments of the invention a method comprises forming a stacked structure in an active region and at least one shallow trench isolation (STI) structure adjacent to the stacked structure. The method further comprises forming a semiconductor layer directly in contact with the at least one STI structure and the stacked structure. The method further comprises patterning the semiconductor layer and the stacked structure to form an active device in the active region and a passive structure of the semiconductor layer directly on the at least one STI structure.

In one or more embodiments of the invention, a method comprises forming a layered structure comprising: forming a high-k dielectric material on a substrate; forming a metal material on the high-k dielectric material; forming a semiconductor material over the metal material; and forming a masking layer over the semiconductor material. The method further comprises patterning the layered structure to form a stacked structure in an active region. The method further comprises forming shallow trench isolation (STI) structures adjacent to the stacked structure in the active region. The method further comprises removing the masking layer, after the formation of the STI structures. The method further comprises forming a semiconductor layer directly on the STI structures and the semiconductor material of the stacked structure. The method further comprises forming at least one passive structure by patterning of the semiconductor layer. The method further comprises forming an active device by the patterning of the semiconductor layer and the stacked structure.

In one or more embodiments of the invention, a structure comprises an active device comprising: a high-k dielectric material on a substrate; a metal material on the high-k dielectric material; and a semiconductor material over the metal material. The structure further comprises a passive structure comprising semiconductor directly in contact with shallow trench isolation structures, adjacent to the active device. The structure further comprises an insulating layer formed between and over the active device and passive structure, wherein the insulating layer is devoid of keyholes. The active device is formed with a height greater than the passive structure.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the semiconductor structure, which comprises the structures of the present invention. In still further embodiments, a method in a computer-aided design system is provided for generating a functional design model of the semiconductor structure. The method comprises generating a functional representation of the structural elements of the semiconductor structure.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and, more particularly, to a metal-oxide-semiconductor field-effect transistor (MOSFET) with integrated passive structures and methods of manufacturing the same. Advantageously, the methods of manufacturing the MOSFET result in a reduction or total elimination of STI (shallow trench isolation) divots, while enabling integration of polysilicon (or other semiconductor material) passive structures (e.g., resistors, efuses, etc.) in high-k dielectric and metal gate flows. Also, in embodiments, the methods of the present invention reduce fabrication processes, by eliminating masking steps which, in turn, reduces overall fabrication time and costs and improves yield of the manufacturing process.

Figure 1:
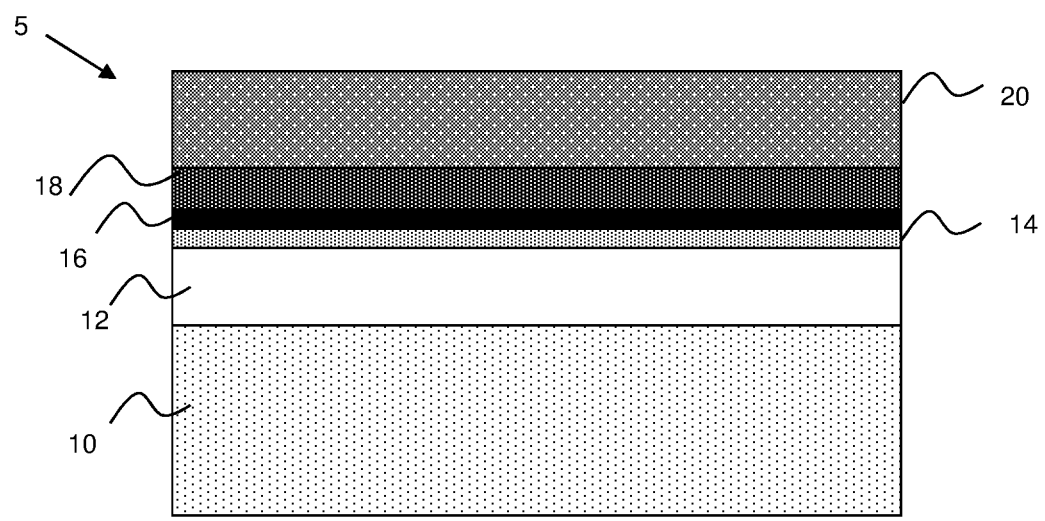
FIGS. 1-7 and 9-11 show processing steps and respective structures in accordance with aspects of the present invention.

FIG. 1 shows a beginning structure in accordance with aspects of the present invention. It should be understood by those of skill in the art that the present invention can be implemented using any conventional silicon-on-insulator (SOI) or bulk silicon technologies, fabricated using known processes, e.g., SiMOX for SOI or other bonding technologies. For purposes of this discussion, the process flows and respective structures of the present invention will be described with regard to an SOI implementation, however, where appropriate, the description will discuss bulk silicon processes.

In FIG. 1, the beginning structure 5 includes a buried oxide layer 10. The buried oxide layer 10 can be formed on any known substrate. A silicon-on-insulator layer 12 is formed on the buried oxide layer 10. In embodiments, the layer 12 can be bonded or formed in any conventional manner on the buried oxide layer 10, as should be understood by those of skill in the art. The layer 12 can be, for example, Si, SiGe, SiC or Ge, GeAs or other known semiconductor materials. A high-k dielectric material 14 is formed on the layer 12. In embodiments, the high-k dielectric material 14 can be, for example, hafnium, hafnium oxide, hafnium dioxide, etc. The high-k dielectric material 14 can be formed by a deposition process, e.g., atomic layer deposition (ALD) or chemical vapor deposition (CVD), to a thickness ranging from about 1 nm to about 200 nm. In embodiments, an interface layer such as an oxide or oxynitride or nitride can be placed between layer 12 and layer 14 (which can also be represented as reference numeral 14).

Still referring to FIG. 1, a metal gate material 16 is formed on the high-k material 14. In embodiments, the metal gate material 16 can be TiN, TaN, Al, or W as examples. The metal gate material 16 can be deposited using a metal sputtering process, CVD, ALD, or a physical vapor deposition process, known to those of skill in the art. In embodiments, the metal gate material 16 can be deposited to a thickness ranging from about 1 nm to about 200 nm. A semiconductor material 18, e.g., silicon based material, is formed on the metal gate material 16. The semiconductor material 18 can be deposited using a conventional CVD such as, for example, low pressure CVD (LPCVD) or rapid thermal CVD (RTCVD). This semiconductor material 18 can be polysilicon or amorphous silicon, and is preferably 5 nm to 200 nm in thickness. In addition to silicon, the semiconductor material 18 can be any semiconductor material such as Ge, SiGe, or SiC. A hardmask 20 is deposited on the semiconductor material 18. The hardmask 20 can be a silicon nitride material, for example.

Figure 2:
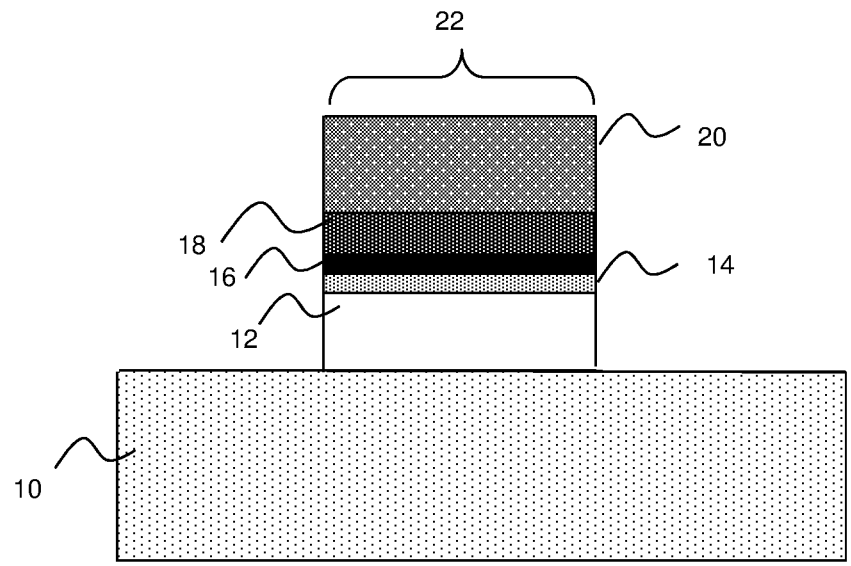

In FIG. 2, the layer 12, high-k material 14, metal gate material 16, the semiconductor material 18 and hardmask 20 can be patterned to form a stacked structure in an active region 22. The patterning can be performed using conventional lithography and etching processes. For example, a photoresist mask can be formed over the hardmask 20 and exposed to energy (light) to form a pattern (opening). A reactive ion etching (RIE) can then be performed to pattern the layers 12, 14, 16, 18 and 20 into a stacked structure in the active region 22. The etching will stop on the buried oxide layer 10. In the bulk implementation, the etching can continue into the bulk layer to about 200 nm+/−100 nm, in order to define the stacked structure in the active region 22.

As should be understood by those of skill in the art, two or more RIE chemistries can be used to pattern the different materials of layers 12, 14, 16, 18 and 20. For example, a first RIE chemistry can be used to remove layers 18 and 20; whereas, additional RIE chemistries can be used to selective remove layers 12, 14 and 16. Any residual resist can be removed using conventional resist strip processes.

Figure 3:
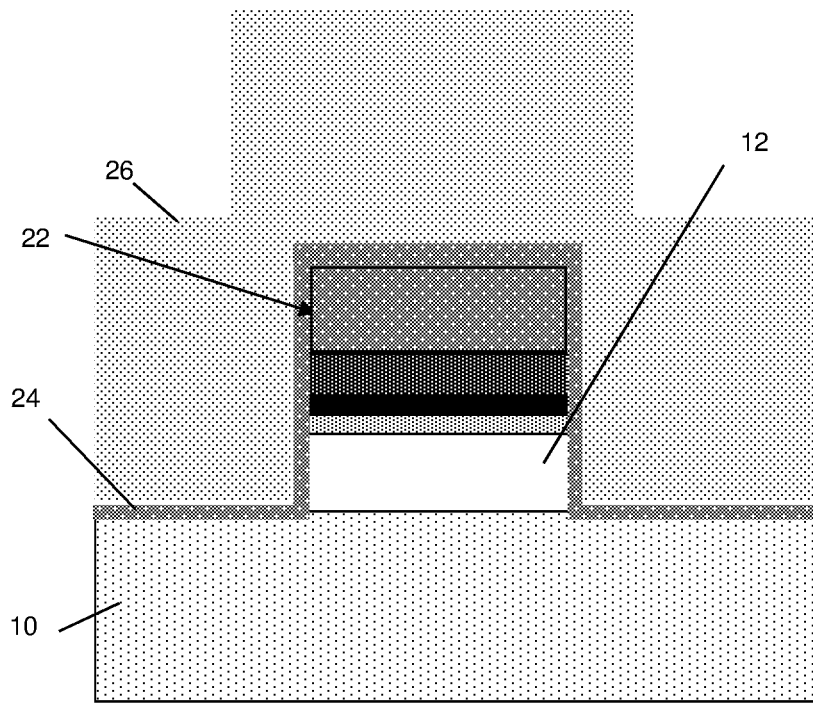

In FIG. 3, a liner 24 is formed over the top and side surfaces of the stacked structure in the active region 22, and exposed surfaces of the buried oxide layer 10. In the bulk implementation, the liner 24 would be formed over the exposed surfaces of silicon (bulk), which can also be schematically represented by the structure of FIG. 3. The liner 24 can be a silicon nitride or silicon oxynitride liner formed to a thickness of about 10 Å to 200 Å; although, other dimensions are also contemplated by the present invention. The liner 24 can be formed using a conventionally known CVD process. In embodiments, the liner 24 will provide protection to the high-k dielectric material 14, during subsequent processes. The liner 24 will also act as an encapsulation during subsequent STI formation processes.

Still referring to FIG. 3, an insulator layer 26 is formed over the liner 24. In embodiments, the insulator layer 26 can be, for example, silicon dioxide ($SiO_2$), deposited using a CVD process. In embodiments, as described further herein, the $SiO_2$ will be used to form recessed STI structures, on sides of the active region 22.

Figure 4:
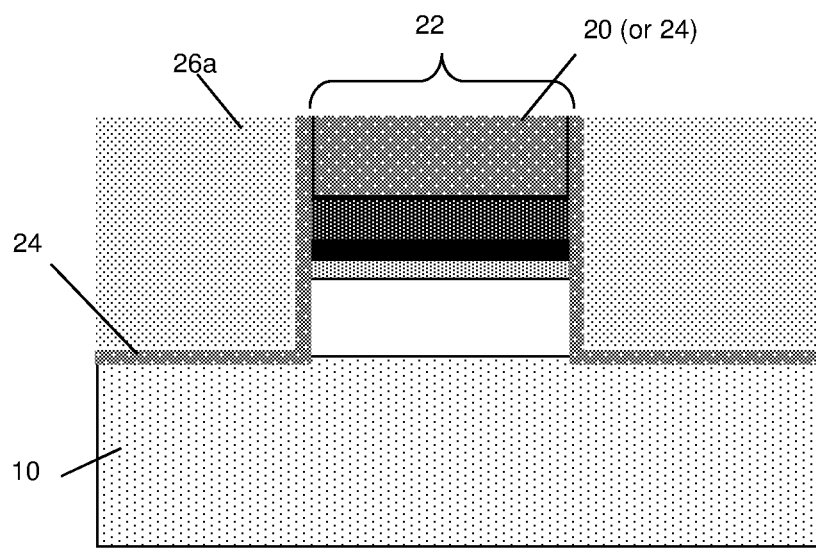

As shown in FIG. 4, the insulator layer 26 is planarized to form regions 26a, separated by the stacked structure formed in the active region 22. For example, in embodiments, the insulator layer 26 can undergo a chemical mechanical polishing (CMP) process, which will stop on either layer 20 or liner 24 (as such layers, in embodiments, may be made of the same material). This CMP process results in insulator regions 26a.

Figure 5:
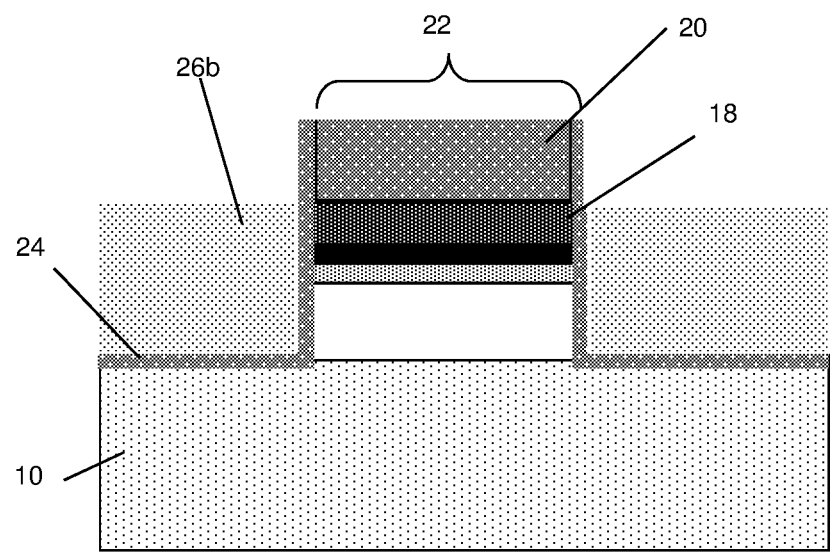

In FIG. 5, the insulator regions 26a (shown in FIG. 4) are recessed by, for example, a selective etching process which forms STI structures 26b. For example, in embodiments, the insulator regions can be recessed by a dilute hydrofluoric acid (DHF) oxide etch, to form STI structures 26b on the sides of the stacked structure in the active region 22. As should be understood by those of skill in the art, the use of DHF does not require the use of an additional masking processes. In embodiments, the STI structures 26b are aligned with the semiconductor material 18 of the stacked structure; that is, the top surface of the STI structures 26b is planar or substantially planar with a top surface of the semiconductor material 18.

Figure 6:
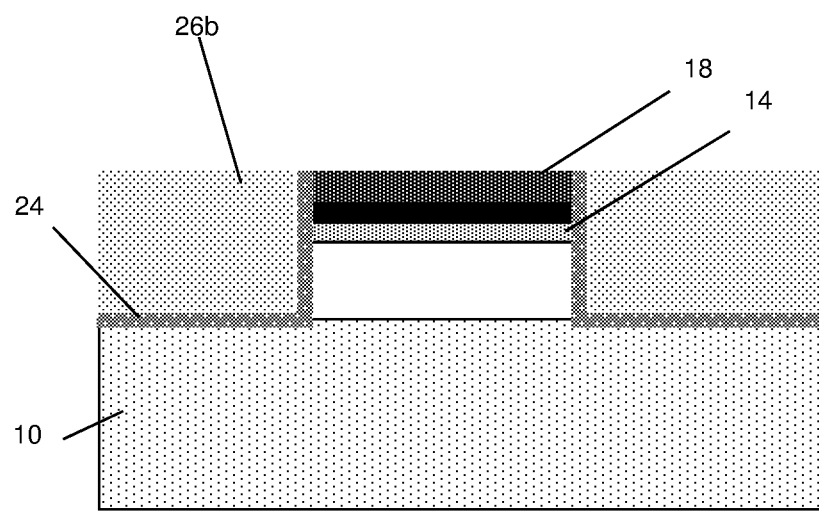

In FIG. 6, the silicon nitride layer (layer 20 shown in FIG. 5) is removed by an etch process such as RIE or aqueous chemical etch. In this way, the structure of FIG. 6 has a planar surface comprising the STI structures 26b and the semiconductor material 18. The nitride liner 24 will protect the high-k dielectric material 14 from attack during the RIE process. In embodiments, the structure of FIG. 6 can undergo a cleaning process in order to ensure that oxide does not form on the semiconductor material 18.

Figure 7:
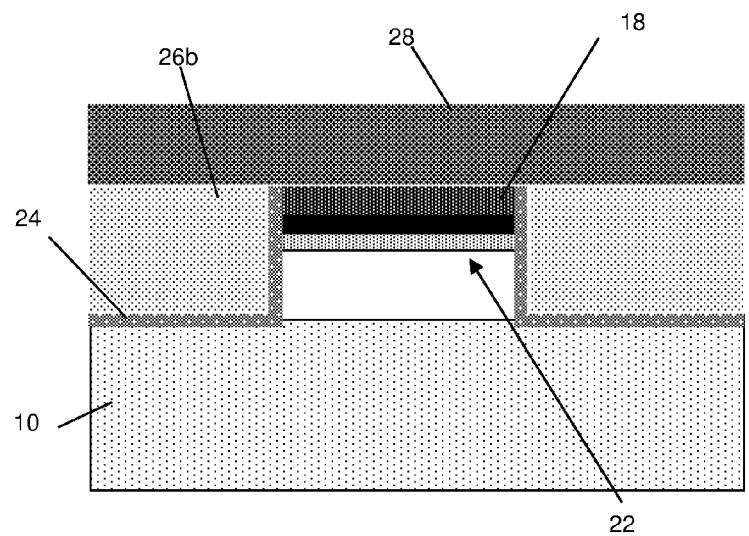

FIG. 7 shows the formation of a semiconductor material 28 over the STI structures 26b and the semiconductor material 18 of the stacked structure in the active region 22. More specifically, the semiconductor material 28 is formed directly in contact with the STI structures 26b (e.g., directly in contact with oxide material) and the semiconductor material 18. Due to the planar structure shown in FIG. 6, the deposition process of the semiconductor material 28 should also result in a substantially planar surface. In embodiments, the semiconductor material 28 can be formed by a CVD such as LPCVD or RTCVD, for example. The semiconductor material 28 can be formed to a thickness of about 5 nm to about 200 nm; although other dimensions are contemplated by the present invention. The semiconductor material 28 can be an amorphous or polysilicon layer, any semiconductor material, including Ge or compound semiconductors such as SiGe, or other materials described herein with regard to the semiconductor material 18.

Figure 8A:
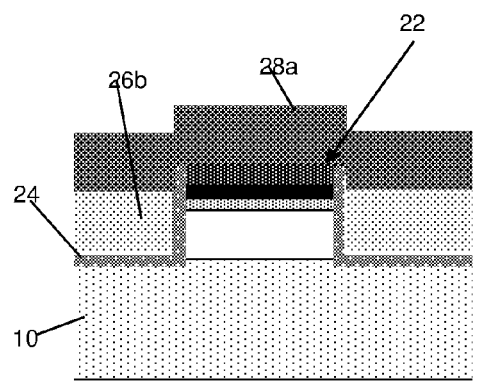
FIGS. 8a and 8b show alternative intermediate structures and respective processing steps in accordance with aspects of the present invention.
Figure 8B:
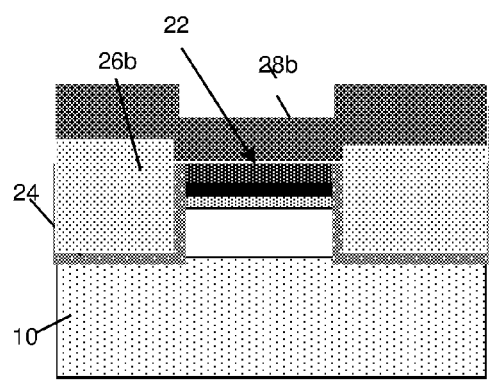

FIGS. 8a and 8b show alternative structures and fabrication processes in accordance with aspects of the present invention. More specifically, FIGS. 8a and 8b show the STI structure 26b being non-planar (not flush) over the stacked structure in the active region 22. For example, in FIG. 8a, an underfill of region 26b results in protrusion 28a of the semiconductor material 28 over the stacked structure in the active region 22; whereas, in FIG. 8b, an overfill of region 26b results in a slight recess 28b of the semiconductor material 28 over the stacked structure in the active region 22. In embodiments, the underfill and overfill can be intentionally used, in order to optimize (e.g., tune) the thickness of the silicon layer 28. In either case, the topography of the structures shown in FIGS. 8a and/or 8b can be planarized to form the structure shown in FIG. 7, such that the top surface of the semiconductor material 28 is substantially planar.

Figure 9:
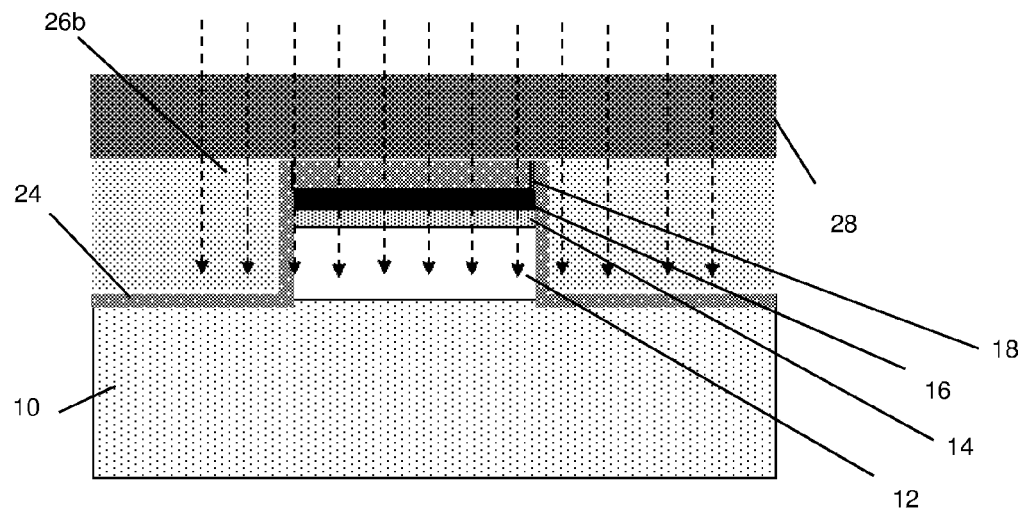

In FIG. 9, well implantation processes are optionally performed through the semiconductor material 28, as represented by the arrows. More specifically, the well implantation process can be, for example, a phosphorous or arsenic implant process for a PFET device, and a boron implant process for a NFET device, but are not restricted to these dopant types or species. In embodiments, the energy and concentration levels of the implant process are sufficient to reach into the semiconductor layer, e.g., layer 12. As should be understood by those of skill in the art, the energy and concentration levels of the implant process can vary, depending on the thickness of the underlying materials and desired device properties.

By way of example, in order to implant through a combined thickness of 50-100 nm for layers 28, 18, 16 and 14 into layer 12, the energy of implantation species such as boron, $BF_2$, arsenic, or phosphorus can be 10 KeV to 200 KeV at an areal concentration of $1E12$ $cm^{-2}$ to $1E14$ $cm^{-2}$. The implants can be masked for each FET type and tuning, as should be understood by those skilled in the art. Advantageously, if the implant process is performed after the deposition of the semiconductor material 28, there is no change in gate topography due to subsequent cleans and resist stripping processes. An optional anneal process can also be performed to diffuse, activate and stabilize the dopants, after the implanting process.

Figure 10:
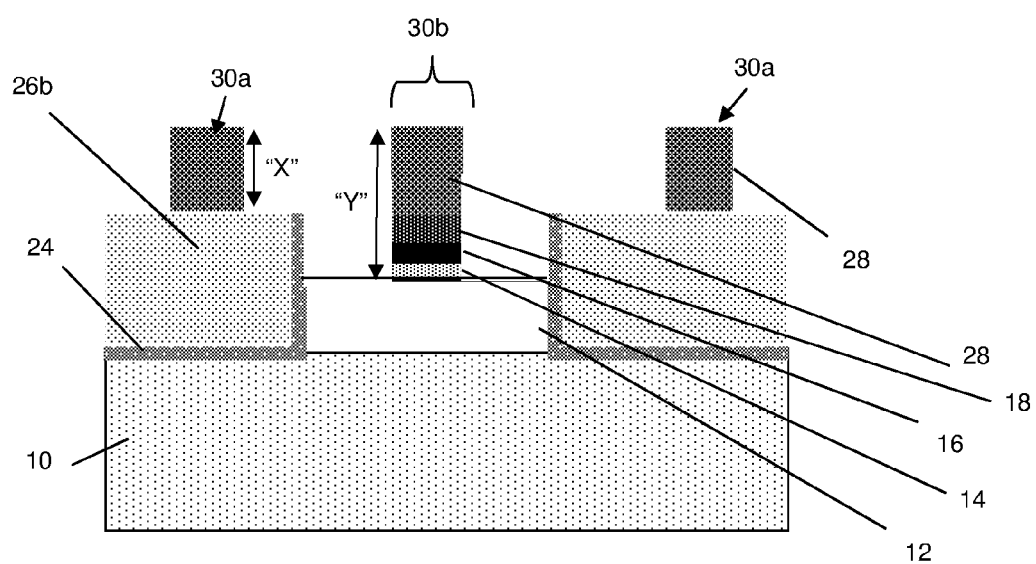

FIG. 10 shows a cross sectional view of the structure, perpendicular to an active device, e.g., transistor, and respective processing steps in accordance with aspects of the present invention. More specifically, in FIG. 10, an etching process is performed to form passive structures 30a (on the STI structures 26b) and an active device 30b, e.g., transistor in the active region. The etching of the semiconductor material 28 to form the active device 30b and the passive structures 30a can be performed in a single patterning step, thus reducing masking steps. The etching process can be, for example, a conventional RIE process performed through the layers 14, 16, 18 and 28 to form the transistor 30b (e.g., MOSFET), and through layer 28 to form the passive structures 30a, over the STI structures 26b. The passive structures 30a can be, for example, an e-fuse or a resistor, and advantageously, will not have any underlying dielectric material (as in conventional structures).

As further shown in FIG. 10, the passive structures 30a only comprise the semiconductor material 28, directly contacting the STI structures 26b; that is, there are no intervening layers, e.g., high-k dielectric and/or metal material, between the semiconductor material 28 of the passive structures 30a and the oxide of the STI structures 26b. Advantageously, this configuration will reduce processing steps by eliminating a masking step that would otherwise be needed to remove the intervening materials in conventional methods and structures. Also, advantageously, this structure will (i) increase the resistance of the resistor by eliminating any metal material under the resistor, (ii) allow the resistance of the silicon resistor to be tuned by adjusting dopant concentrations, or (iii) eliminate unwanted electrical shorts of an e-fuse structure, even after the e-fuse is blown (which would otherwise result when metal material remains intact under the e-fuse).

Still referring to FIG. 10, the passive structures 30a and the transistor 30b are formed at different heights (due to the height of the STI structures 26b), e.g., the passive structures 30a are formed with a height of "X" and the transistor gate 30b is formed with a height of "Y", where Y>X. As an example, the height "X" of the passive structures 30a can be about 200 Å or more. As discussed in more detail with reference to FIG. 11, this aspect ratio will avoid insulator void-fill issues.

As further shown in FIG. 10, the top surface of the passive structures 30a and the transistor gate 30b are substantially coplanar. This uniformly level top surface of the passive devices 30a and transistor gates 30b make gate patterning lithography more straightforward to perform and subsequent depositions easier to fill uniformly, compared to conventional structures and methods which may result in the top surface of the passive device and transistor gate varying in height.

Figure 11:
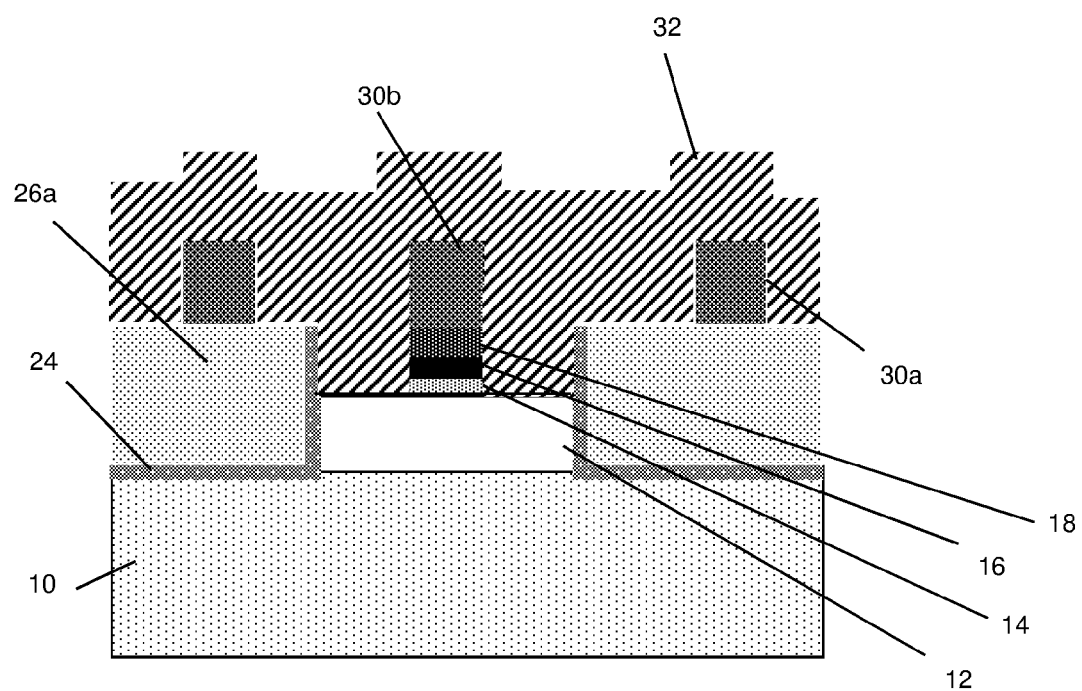

As shown in FIG. 11, an insulating layer 32 is formed over and between the passive structures 30a and the transistor 30b. In embodiments, the insulating layer 32 can be formed by conventional deposition processes, e.g., CVD. The insulating layer 32 can be a compressive stress liner or a tensile stress liner or a neutral stress film, depending on the type of transistor. For example, a compressive stress liner can be used for a PFET type device; whereas, a tensile stress liner can be used for a NFET type device. As an example, the insulating layer 32 can be silicon nitride or oxide or a combination thereof. It should be understood by those skilled in the art that there are additional fabrication steps are provided between patterning of the gates 30a and passive devices 30b shown in FIG. 10, and the deposition of the insulating layers shown in FIG. 11. These intervening process steps can include spacer formations, implants, source/drain formations and silicide formation, all known to those of skill in the art.

Advantageously, as the height "X" of passive structure 30a is shorter than the height "Y" of the transistor 30b, it is now possible to form the insulating layer 32 without any keyholes (e.g., void-fill issues). As should be understood by those of skill in the art, the presence of keyholes lead to undesired tungsten in the insulating layer causing shorts, however, for the shorter height of the passive structures 30a, the aspect ratio is reduced and easier to fill.

Figure 12:
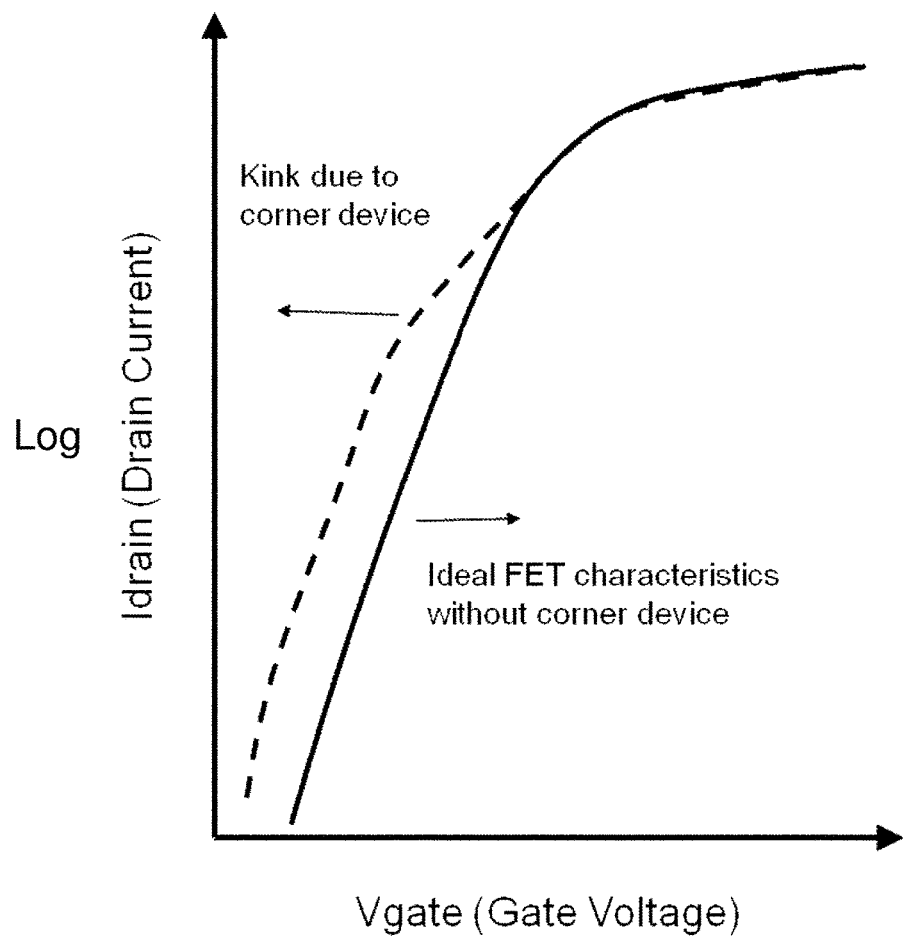
FIG. 12 shows a comparison graph of devices manufactured in accordance with the present invention vs. a conventional structure.

FIG. 12 shows a comparison graph of structures manufactured in accordance with the present invention vs. a conventional structure. In FIG. 12, the Y axis is a measurement of drain current in log scale, and the X axis shows gate voltage. As shown, line "B" is representative of the structure of the present invention having ideal characteristics; whereas line "A" is representative of a conventional structure having a kink due to corner device effect. As should be understood by those of ordinary skill in the art, the structure of the present invention exhibits ideal characteristics, i.e., higher threshold voltage compared to the conventional structure, due to the fabrication processes and structure that reduce or eliminate STI divots.

Figure 13:
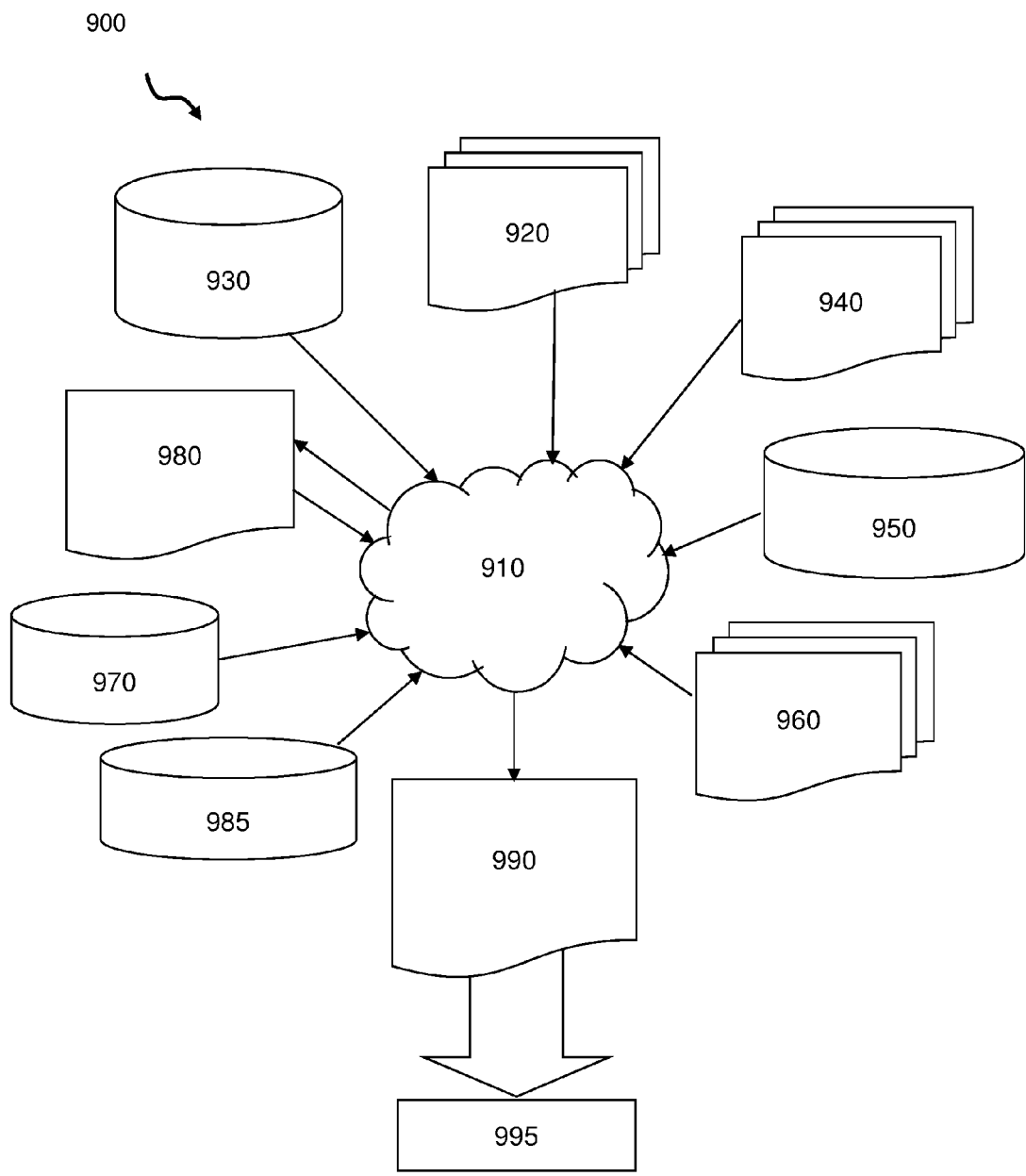
FIG. 13 is a flow diagram of a design process used in semiconductor design, manufacture, and/or test.

FIG. 13 is a flow diagram of a design process used in semiconductor design, manufacture, and/or test. FIG. 13 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-11. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 13 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-11. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-11 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-11. In one embodiment, design structure 990 may comprise a compiled, executable HDL simulation model that functionally simulates the devices shown in FIGS. 1-11.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-11. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method comprising:
   forming a layered structure comprising:
      forming a high-k dielectric material on a substrate;
      forming a metal material on the high-k dielectric material; and
      forming a semiconductor material over the metal material;
   patterning the layered structure to form a stacked structure;
   forming shallow trench isolation (STI) structures adjacent to the stacked structure;
   forming a semiconductor layer on the STI structures and the semiconductor material of the stacked structure;
   forming at least one passive structure from the semiconductor layer; and
   forming an active device from the semiconductor layer and the stacked structure.

2. The method of claim 1, further comprising fine tuning the semiconductor layer prior to the forming of the active device and the passive structure.

3. The method of claim 1, further comprising implanting regions after the forming of the semiconductor layer, wherein the implanting is of such a concentration and energy that it penetrates through the stacked structure into the substrate.

4. The method of claim 1, wherein a top surface of the STI structures and the semiconductor material are planar by etching a masking layer of the layered structured and part of the STI structure.

5. The method of claim 1, further comprising forming a liner on the stacked structure, prior to the forming of the STI structures, wherein:
   the stacked structure is patterned prior to the formation of the STI structures; and
   the active device is formed with a height higher than the passive structure.

6. The method of claim 5, further comprising forming an insulating layer over and between the active device and the passive structure, wherein the forming of the insulating layer is devoid of keyholes due to an aspect ratio between the passive structure and the active device.

7. The method of claim 1, wherein the STI structures are non-planar over the stacked structure.

8. The method of claim 7, wherein the STI structures are formed by using an underfill of region resulting in protrusion of semiconductor material over the stacked structure.

9. The method of claim 8, wherein the protrusion is planarized to form planar STI structures.

10. The method of claim 7, wherein the STI structures are formed by using an overfill of region resulting in a recess of semiconductor material over the stacked structure.

11. The method of claim 10, wherein the semiconductor material is planarized to form planar STI structures.

12. The method of claim 1, wherein the high-k dielectric material is a hafnium based material.

13. The method of claim 1, further comprising forming a masking layer over the semiconductor material.

14. The method of claim 1, wherein the patterning the layered structure comprises patterning the layered structure to form the stacked structure in an active region.

15. The method of claim 14, wherein the forming the STI structures adjacent to the stacked structure comprises forming the STI structures in the active region.

16. The method of claim 15, further comprising forming an insulating layer over and between the active device and the passive structure, wherein the insulating layer includes a stepped feature and the at least one passive structure and the active device is formed on a buried oxide layer.

* * * * *